US006769174B2

(12) United States Patent
Siegel et al.

(10) Patent No.: US 6,769,174 B2
(45) Date of Patent: Aug. 3, 2004

(54) LEADFRAMELESS PACKAGE STRUCTURE AND METHOD

(75) Inventors: Harry M. Siegel, Hurst, TX (US); Anthony M. Chiu, Richardson, TX (US)

(73) Assignee: STMicroeletronics, Inc., Carrollton, TX (US)

( * ) Notice: Subject to any disclaimer, the term of this patent is extended or adjusted under 35 U.S.C. 154(b) by 0 days.

(21) Appl. No.: 10/205,692

(22) Filed: Jul. 26, 2002

(65) Prior Publication Data

US 2004/0017668 A1 Jan. 29, 2004

(51) Int. Cl.[7] .................................................. H05K 3/30
(52) U.S. Cl. .............................. 29/832; 29/840; 29/855
(58) Field of Search .......................... 29/841, 837, 832, 29/840, 842, 855

(56) References Cited

U.S. PATENT DOCUMENTS

| 5,218,759 | A | * | 6/1993 | Juskey et al. ................. 29/840 |
| 5,480,503 | A | * | 1/1996 | Casey et al. ............. 156/89.18 |
| 5,620,928 | A | * | 4/1997 | Lee et al. .................... 438/118 |
| 6,130,473 | A | * | 10/2000 | Mostafazadeh et al. ..... 257/666 |
| 6,247,229 | B1 | * | 6/2001 | Glenn |
| 2002/0027010 | A1 | * | 3/2002 | Glenn |
| 2002/0100165 | A1 | * | 8/2002 | Glenn |

* cited by examiner

*Primary Examiner*—Carl J. Arbes
(74) *Attorney, Agent, or Firm*—Lisa K. Jorgenson; William A. Munck

(57) ABSTRACT

A method for providing a leadframeless package structure is provided. The method includes providing a temporary carrier. The temporary carrier is coupled to a metal foil layer with a temporary adhesive layer. An integrated circuit chip is coupled to the metal foil layer. The temporary adhesive layer and the temporary carrier are removed to form the leadframeless package structure after molding.

20 Claims, 3 Drawing Sheets

LEADFRAMELESS PACKAGE STRUCTURE AND METHOD

TECHNICAL FIELD OF THE INVENTION

The present invention is directed in general to integrated circuits and, more specifically, to a leadframeless package structure and method.

BACKGROUND OF THE INVENTION

A conventional integrated circuit package generally comprises a leadframe made from 0.005-inch thick metal, an integrated circuit made of silicon, and a protective material to protect the electrical connections between the integrated circuit and the leadframe. The leadframe acts as an electrical and mechanical interface between the integrated circuit and the printed circuit board (PCB) on which the integrated circuit package is soldered. These packages are generally known as Dual-In-Line Package (DIP), Small Outline package (SO), or Quad Flat Package (QFP). In the manufacturing of these packages with leadframes, heavy industrial tools such as stamping and forming are required. These tools are expansive and dedicated to one package size and pin count. A leadframeless package is highly desirable because it requires a minimum of dedicated tooling such as, for example, one photomask and one solder ball fixture.

Recent development of higher pin count packages has substituted the leadframe with a fiberglass material. These packages are generally known as Ball Grid Array (BGA). The fiberglass material has metal foils (0.0015-inch thick) on the top and bottom sides and conductor patterns are etched on both sides to connect the die to the PCB.

Conventional packaging options for high performance integrated circuit dice include the use of a substrate or leadframe as a carrier. These are normally incorporated permanently in the final package structure. Disadvantages associated with these package structures include a limited ability to re-use the leadframe or substrate for another die. The leadframe or substrate becomes a fixed material cost for every package manufactured. The tooling for stamping the leadframe and the artwork for etching new substrates are quite substantial when there is a change in die size as the feature size of the integrated circuit is shrunk. In addition, the substrate or leadframe contributes to the thickness of the package structure, which is generally desired to be minimized. Also, when solder balls are used with the integrated circuit die, as in BGA packages, the width and depth of the package structure may be greater than desired due to the inclusion of the connections to the solder balls that are exterior to the area encompassed by the die.

SUMMARY OF THE INVENTION

In accordance with the present invention, a leadframeless package structure and method are provided that substantially eliminate or reduce disadvantages and problems associated with conventional systems and methods. In particular, a temporary carrier that is coupled to the structure during formation is removed after formation is complete, resulting in a structure without a leadframe.

According to one embodiment of the present invention, a leadframeless package structure is provided that includes a temporary carrier, a metal foil layer, an integrated circuit chip, a plurality of bonding wires, and a molding compound. After attaching the metal foil layer to the temporary adhesive/carrier system, the metal foil is patterned and etched (using conventional techniques commonly known in the PCB industry) to produce a set of planar electrical traces, die attach pads and bonding pads. The die is then attached (using conventional semiconductor assembly techniques) to the special die attach pad formed in the metal foil. Subsequently, conventional wirebond techniques are used to form electrical interconnects between the die and the electrical traces in the metal foil. Special pads are also provided in the metal foil for this purpose. Following a molding step, which encases the delicate wirebonds and die with a plastic which provides rigidity and protection, the temporary carrier portion is removed.

Technical advantages of one or more embodiments of the present invention include providing an improved leadframeless package structure. In a particular embodiment, a temporary carrier is coupled to the structure with a suitable adhesive layer during formation. The adhesive and carrier system are removed after molding. As a result, the chips attached to the structure have no leadframes or substrates. Accordingly, the leadframeless package structure has a reduced fixed cost of materials, is capable of accommodating large and small dice at minimum tooling cost, has a reduced thickness due to the absence of a carrier, and can provide a chip-scale package when second level interconnects (e.g., solder pads) are located within the approximate footprint of the die.

Other technical advantages will be readily apparent to one skilled in the art from the following figures, description, and claims.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented for any suitably arranged leadframeless package structure.

Figure 1A:
FIGS. 1A–E are a series of schematic cross-sectional diagrams illustrating a method for forming a leadframeless package structure in accordance with one embodiment of the present invention.

Referring to FIG. 1A, an initial structure 10 for a leadframeless package structure comprises a temporary carrier 20 and a temporary adhesive layer 30. The temporary carrier 20 may comprise any rigid or semi-rigid material that is compatible with the chemical and thermal processes encountered in the normal semiconductor packaging assembly process which will serve as a base on which the leadframeless package structure may be formed. Examples of such materials would include conventional metals, such as stainless steel or aluminum, and high temperature plastics and plastic composites, such as laminate epoxy fiberglass.

The temporary adhesive layer 30 is formed over the temporary carrier 20. The temporary adhesive layer 30 may be formed by any suitable means. The temporary adhesive layer 30 comprises a material that may be removed from a metal layer without damage to the metal layer. For example, the temporary adhesive layer 30 may comprise silicone or other suitable adhesive material.

Figure 1B:
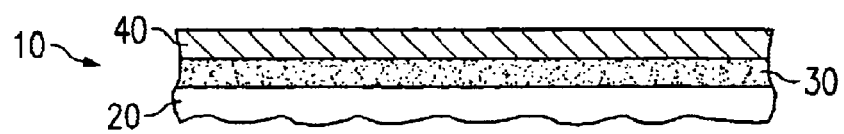

Referring to FIG. 1B, a metal foil layer 40 is conventionally joined to the temporary adhesive layer 30. According to one embodiment, the metal foil layer 40 comprises gold-plated copper. According to another embodiment, the metal foil layer 40 comprises copper without gold-plating. For this embodiment, after the metal foil layer 40 is patterned as described in more detail below, a solder mask may be formed outwardly of the metal foil layer 40 and used to expose solder areas, which may then have gold or other suitable material applied to them. However, it will be understood that the metal foil layer 40 may comprise any suitable conducting material without departing from the scope of the present invention. The metal foil layer 40 may be about 5 $\mu$m (0.0002 inch) thick.

A mask (not illustrated in FIG. 1B) is conventionally formed outwardly of the metal foil layer 40. The mask, which comprises a material that is sensitive to light, is patterned through a process that generally includes photolithography and etching. The mask forms a pattern that corresponds to circuit patterns to be formed in the metal foil layer 40, with the material of the mask remaining over the metal foil layer 40 over portions corresponding to the circuit patterns. The portion of the metal foil layer 40 that is exposed is removed by an etch process while the remaining portion of the metal foil layer 40 is protected by the mask.

Figure 3A:
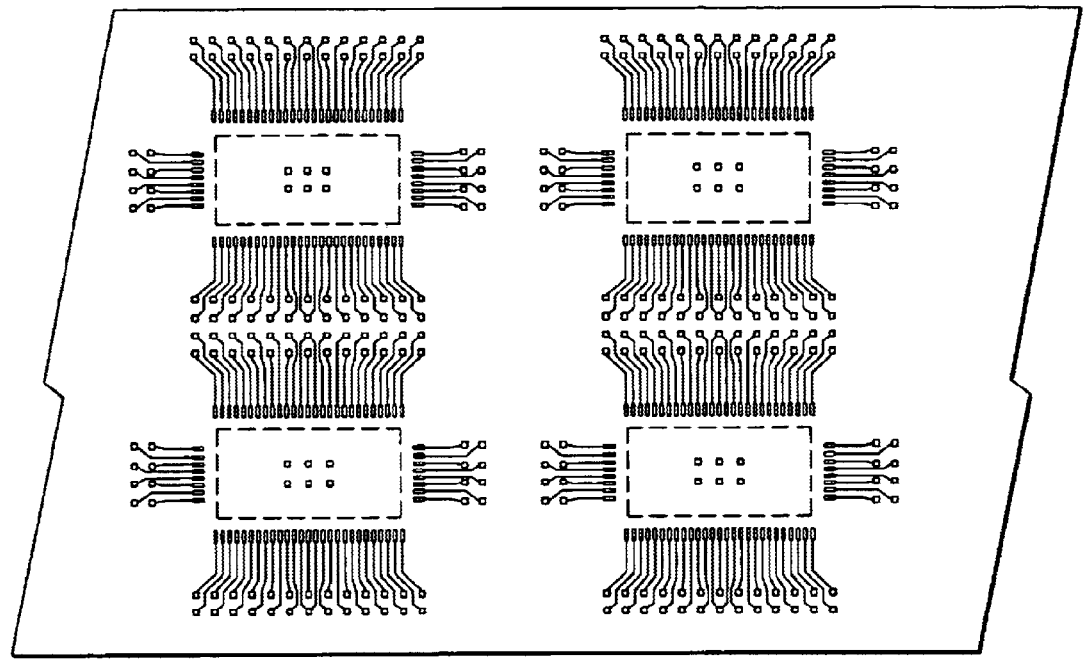
FIG. 3A is a schematic top-view diagram illustrating circuit patterns formed in the metal foil layer of FIG. 1 or 2 in accordance with one embodiment of the present invention.
Figure 3B:
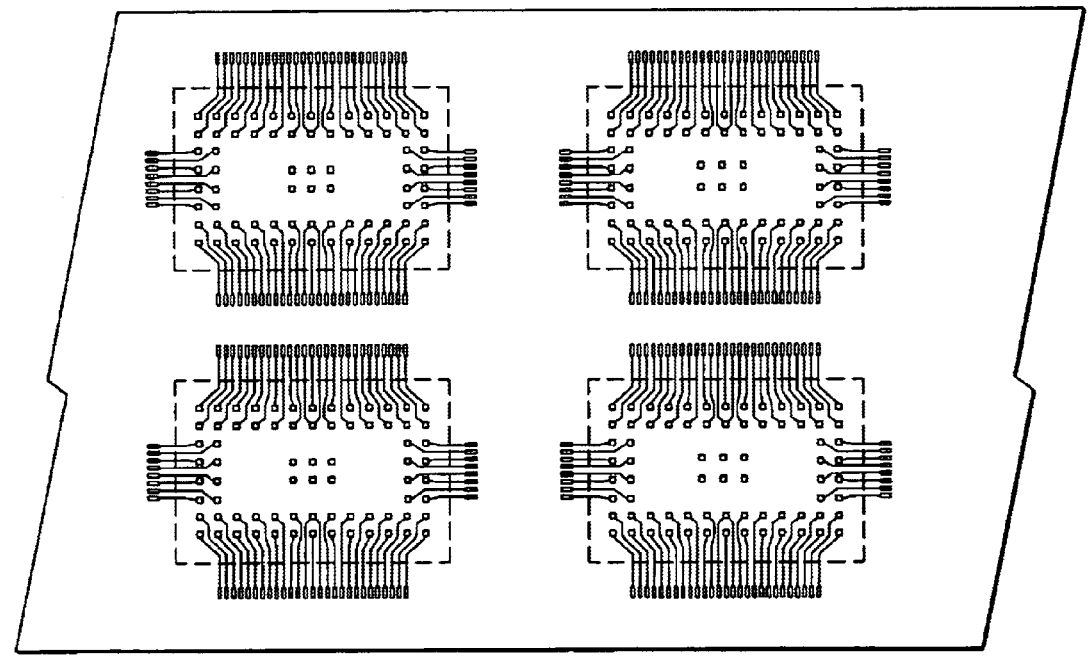
FIG. 3B is a schematic top-view diagram illustrating circuit patterns formed in the metal foil layer of FIG. 1 or 2 in accordance with another embodiment of the present invention.

The temporary adhesive layer 30 is selected to be unaffected or minimally influenced by a brief exposure to etchant. The mask may then be removed with a resist stripping process, resulting in the circuit patterns being formed in the metal foil layer 40. Top views of the structure 10 following this step are illustrated in FIGS. 3A–B.

Figure 1C:
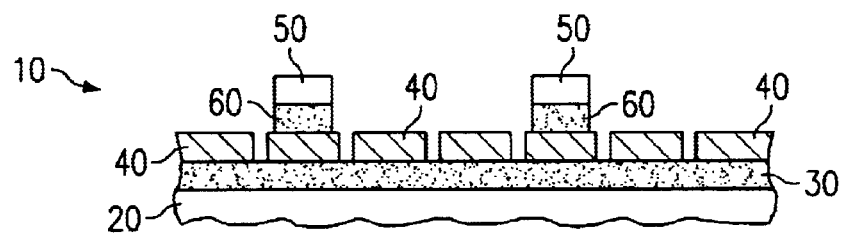

Referring to FIG. 1C, a plurality of integrated circuit dies, or chips, 50 are conventionally attached to the metal foil layer 40 with a permanent adhesive 60 either as matrixed groups of related dice or as individual dice arrayed in a matrix format. The chips 50 may each comprise a microprocessor, a microcontroller, a memory device, an application-specific integrated circuit, or any other suitable device. As used herein, "each" means every one of at least a subset of the identified items.

The permanent adhesive 60 comprises a non-conductive material that will adhere to the metal foil layer 40 and to the chips 50 indefinitely. For example, the permanent adhesive 60 may comprise an epoxy, such as QMI 536, manufactured by Quantum Materials, Inc., or other suitable adhesive material.

Figure 1D:
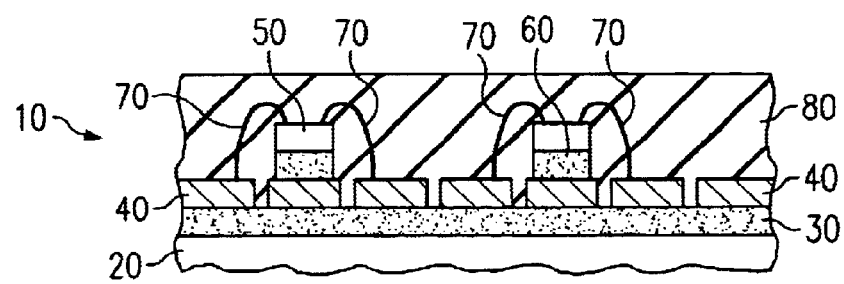

Referring to FIG. 1D, bonding wires 70 are conventionally formed from the chips 50 to the metal foil layer 40. The bonding wires 70 may comprise a gold alloy or other suitable electrically conductive material. The bonding wires 70 serve to couple bond pads on the chips 50 to specified metal traces in the circuit patterns in the metal foil layer 40. Solder pads patterned in the specified metal traces may then be used to couple the specified areas of the chips 50 to a mating printed circuit board through solder balls or other suitable coupling means, as described below in connection with FIG. 1E.

A molding compound 80 is conventionally formed outwardly of the metal foil layer 40 and the chips 50. The molding compound 80 forms a rigid encasement that covers the metal foil layer 40, the chips 50, and the bonding wires 70, thereby protecting the electrical connections between the chips 50 and the metal foil layer 40. The molding compound 80 may comprise any suitable insulative material, such as epoxy novolac thermoset plastic__EME 6600, manufactured by Sumitomo Bakelite Co., Ltd., or the like. The chips 50 may be arrayed in a matrix of groups of related dice or in a matrix array of individual dice. It is possible to overmold the entire array of dice or array of groups of dice at once using a single cavity or alternatively to overmold individual dice or individual groups of dice using a cavity for each group or unit. If the former method is used, the individual components will need to be singulated from the bulk group using conventional semiconductor assembly manufacturing techniques.

Figure 1E:
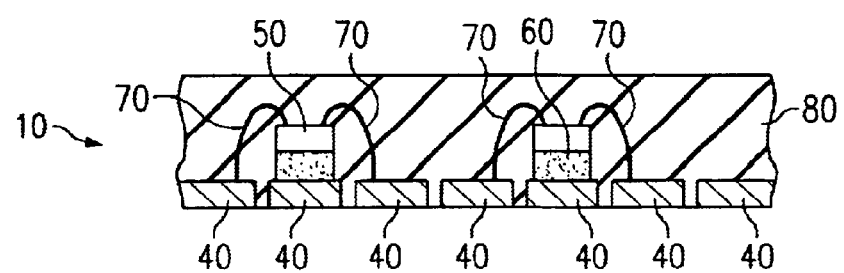

Referring to FIG. 1E, the temporary adhesive layer 30 is removed from the structure 10, resulting in the removal of the temporary carrier 20 as well. The temporary adhesive layer 30 may be removed by thermally softening the adhesive bond to the metal foil layer 40 and molding compound or by using any other suitable means. The adhesive material of the temporary adhesive layer 30 can be selected so that the its adhesion to the temporary carrier 20 is greater than to the metal foil layer 40 or the molding compound 80 in a system analogous to liners used to temporarily transport labels or stickers.

The resulting structure 10 may then be coupled to a printed circuit board (not illustrated in FIG. 1E) using solder balls or other suitable coupling means. According to one embodiment, solder balls may be attached to the structure 10 through the metal foil layer 40 opposite of and directly underneath each chip 50 in a convention known as "fan in," as illustrated in FIG. 3A. In this configuration, the solder balls are placed over the circular portion of the metal traces, and outside of the die area, as represented by the dashed-lines in the figure. According to another embodiment, solder balls may be attached to the structure 10 through the metal foil layer 40 opposite of each chip 50, but underneath an area surrounding the perimeter of the chip 50 in a convention know as "fan out," as illustrated in FIG. 3B. It will be understood, however, that the coupling means used may be provided in any suitable manner without departing from the scope of the present invention.

Thus, the structure 10 provides a set of chips 50 without leadframes or carriers. Thus, this leadframeless package structure 10 has a minimum material cost, is capable of more easily accommodating die size changes with minimum tooling cost for the patterning of one layer instead of multiple layers in a BGA substrate, has a reduced thickness due to the lack of leadframes or substrates, and provides a chip-scale package when the solder pads are arrayed approximately underneath the chip 50.

Figure 2A:
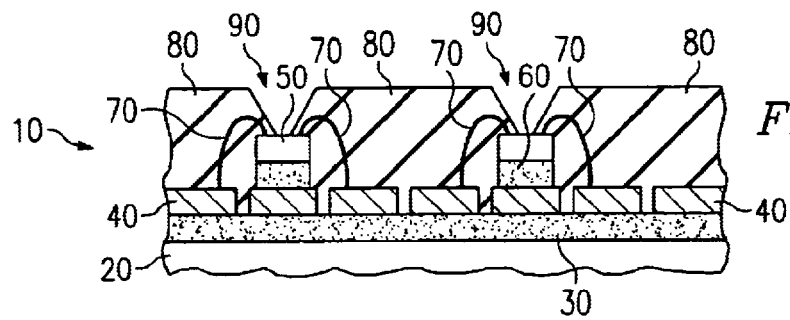
FIGS. 2A–B are schematic cross-sectional diagrams illustrating an alternate embodiment for the steps illustrated in FIGS. 1D–E.
Figure 2B:
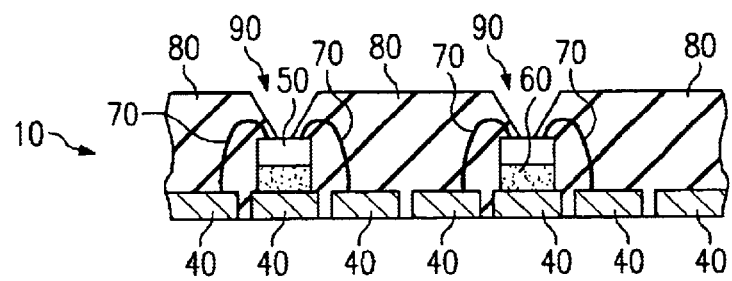

FIGS. 2A–B are schematic cross-sectional diagrams illustrating an alternate embodiment for the steps illustrated in FIGS. 1D–E. Thus, referring to FIG. 2A, an alternate embodiment is illustrated for the steps of FIG. 1D.

As described in connection with FIG. 1D, bonding wires 70 are conventionally formed from the chips 50 to the metal foil layer 40 and a molding compound 80 is conventionally formed outwardly of the metal foil layer 40 and the chips 50. However, for the embodiment illustrated in FIG. 2A, the molding compound 80 is absent from selected areas over the chips 50 such that a surface 90 of each chip 50 is exposed. For this embodiment, the molding compound 80 may be formed selectively over and around portions of each chip 50 in order to expose the surface 90 of each chip 50.

Thus, the molding compound 80 is operable to cover the metal foil layer 40, the areas of the chip 50 other than the exposed surface 90, and the bonding wires 70, thereby protecting the electrical connections between the chips 50 and the metal foil layer 40.

Referring to FIG. 2B, the temporary adhesive layer 30 is removed from the structure 10 as described above in connection with FIG. 1E, resulting in the removal of the temporary carrier 20 as well. The resulting structure 10 then comprises the exposed surfaces 90 of the chips 50.

FIGS. 4A–D are schematic top-view diagrams illustrating the leadframeless package structure 10 in accordance with multiple embodiments of the present invention. For each of the embodiments illustrated in FIGS. 4A–D, the chips 50 may comprise the chips 50 illustrated in FIGS. 1 and 2 and may be formed in a leadframeless package structure 10, as described above in connection with FIGS. 1 and 2.

Figure 4A:
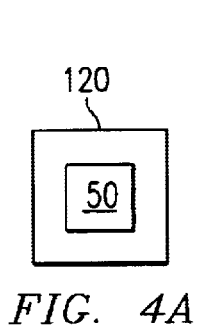
FIGS. 4A–D are schematic top-view diagrams illustrating the leadframeless package structure of FIG. 1 or 2 in accordance with multiple embodiments of the present invention.
Figure 4B:
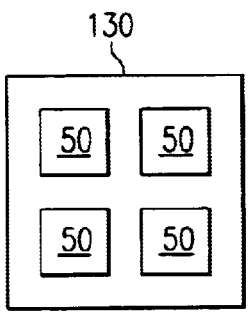

For the embodiment illustrated in FIG. 4A, a discrete cavity is used to form a molded section 120 for each chip 50, while for the embodiment illustrated in FIG. 4B, a discrete cavity is used to form a molded section 130 for each of a plurality of a matrices of chips 50. Each matrix of chips 50 shares a single substrate and forms a multi-chip module. Although the illustrated embodiment comprises four chips 50 in the multi-chip module, it will be understood that each multi-chip module may comprise any suitable number of chips 50 without departing from the scope of the present invention.

Figure 4C:
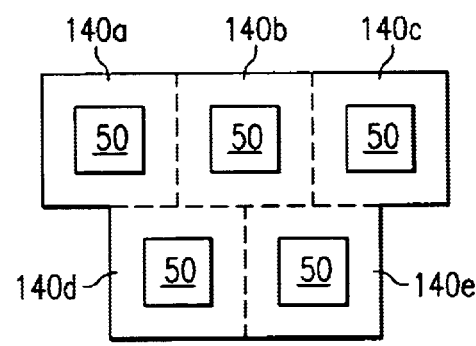

For the embodiment illustrated in FIG. 4C, a single cavity is used to form a molded section 140 for each of a plurality of chips 50. After the molded section 140 is formed, the molded section 140 may be separated in order to form a molded section 140a–e for each of the chips 50 in a process known as singulation. The singulation may be accomplished by sawing apart the molded section 140, by breaking apart the molded section 140, or by any other suitable means.

Figure 4D:
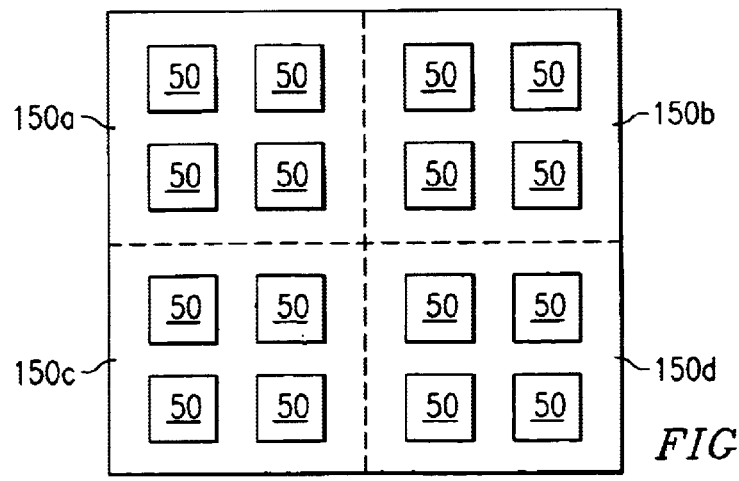

For the embodiment illustrated in FIG. 4D, a single cavity is used to form a molded section 150 for each of a plurality of a matrices of chips 50. Each matrix of chips 50 shares a single substrate and forms a multi-chip module. After the molded section 150 is formed, the molded section 150 may be separated in order to form a molded section 150a–d for each of the multi-chip modules by singulation. The singulation may be accomplished by sawing apart the molded section 150, by breaking apart the molded section 150, or by any other suitable means.

Although the illustrated embodiment comprises four chips 50 in each multi-chip module, it will be understood that each multi-chip module may comprise any suitable number of chips 50 without departing from the scope of the present invention. In addition, although the illustrated embodiment comprises four multi-chip modules for the molded section 150, it will be understood that each molded section 150 may comprise any suitable number of multi-chip modules without departing from the scope of the present invention.

Although the present invention has been described with several embodiments, various changes and modifications may be suggested to one skilled in the art. It is intended that the present invention encompass such changes and modifications as fall within the scope of the appended claims.

What is claimed is:

1. A method for providing a leadframeless package structure, comprising:
    providing a temporary carrier;
    coupling the temporary carrier to a metal foil layer with a temporary adhesive layer;
    coupling an integrated circuit chip to the metal foil layer; and
    removing the temporary adhesive layer and the temporary carrier to form the leadframeless package structure after molding.

2. The method of claim 1, the temporary carrier comprising one of aluminum, stainless steel, and laminate epoxy fiberglass.

3. The method of claim 1, the temporary adhesive layer comprising silicone.

4. The method of claim 1, the metal foil layer comprising one of gold-plated copper and non-gold-plated copper.

5. The method of claim 1, coupling an integrated circuit chip to the metal foil layer comprising coupling the chip to the metal foil layer with a permanent adhesive.

6. The method of claim 5, the permanent adhesive comprising an epoxy resin.

7. The method of claim 1, further comprising patterning and etching the metal foil layer to form circuit patterns.

8. The method of claim 7, further comprising:
    coupling each of a plurality of bond pads on the chip to the patterned metal foil layer with one of a plurality of bonding wires; and
    forming a molding compound over the metal foil layer, the bonding wires and the chip.

9. The method of claim 8, forming a molding compound comprising forming the molding compound selectively over and around portions of the chip to expose a surface of the chip.

10. A method for providing a leadframeless package structure, comprising:

providing a temporary carrier;

forming a temporary adhesive layer adjacent to the temporary carrier;

forming a metal foil layer outwardly of the temporary adhesive layer;

patterning and etching the metal foil layer to form circuit patterns;

coupling an integrated circuit chip to the metal foil layer;

coupling each of a plurality of bond pads on the chip to the patterned metal foil layer with one of a plurality of bonding wires;

forming a molding compound outwardly of the metal foil layer, the bonding wires and the chip; and removing the temporary adhesive layer and the temporary carrier to form the leadframeless package structure.

11. The method of claim 10, the temporary carrier comprising one of aluminum, stainless steel, and laminate epoxy fiberglass.

12. The method of claim 10, the temporary adhesive layer comprising silicone.

13. The method of claim 10, the metal foil layer comprising one of copper and gold-plated copper.

14. The method of claim 10, forming a molding compound comprising forming the molding compound selectively over and around portions of the chip to expose a surface of the chip.

15. A method for providing a leadframeless package structure, comprising:

coupling a temporary carrier to a metal foil layer with a temporary adhesive layer;

patterning and etching the metal foil layer to form circuit patterns using an etchant, wherein the temporary carrier is at most minimally influenced by exposure to the etchant;

coupling an integrated circuit chip to the metal foil layer;

forming a molding compound outwardly of the metal foil layer and the chip, the molding compound formed selectively over and around portions of the chip to expose a surface of the chip; and removing the temporary adhesive layer and the temporary carrier to form the leadframeless package structure.

16. The method of claim 15, the temporary carrier comprising one of aluminum, stainless steel, and laminate epoxy fiberglass.

17. The method of claim 15, the temporary adhesive layer comprising silicone.

18. The method of claim 15, the metal foil layer comprising one of gold-plated copper and non-gold-plated copper.

19. The method of claim 18, further comprising coupling each of a plurality of bond pads on the chip to the patterned metal foil layer with one of a plurality of bonding wires.

20. The method of claim 15, further comprising forming a solder mask outwardly of the patterned metal foil and using the solder mask to expose solder areas.

* * * * *